(12) United States Patent
Gu et al.

(10) Patent No.: US 8,304,317 B2
(45) Date of Patent: Nov. 6, 2012

(54) GATE LINE EDGE ROUGHNESS REDUCTION BY USING 2P/2E PROCESS TOGETHER WITH HIGH TEMPERATURE BAKE

(75) Inventors: Yiming Gu, Pu Dong New Area (CN); James Walter Blatchford, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 198 days.

(21) Appl. No.: 12/648,802

(22) Filed: Dec. 29, 2009

(65) Prior Publication Data
US 2010/0167484 A1 Jul. 1, 2010

Related U.S. Application Data

(60) Provisional application No. 61/142,072, filed on Dec. 31, 2008.

(51) Int. Cl.
*H01L 21/8324* (2006.01)
(52) U.S. Cl. . 438/294; 438/586; 438/275; 257/E21.038; 430/311
(58) Field of Classification Search .................. 438/275, 438/294, 586, 689, 719, 592; 430/311–325
See application file for complete search history.

(56) References Cited

U.S. PATENT DOCUMENTS

| | | | |
|---|---|---|---|
| 6,168,997 B1 * | 1/2001 | Tseng | 438/275 |
| 6,582,891 B1 | 6/2003 | Hallock et al. | |
| 6,764,946 B1 | 7/2004 | Amblard | |
| 6,838,347 B1 | 1/2005 | Liu et al. | |
| 7,405,032 B1 | 7/2008 | Amblard et al. | |
| 2003/0203319 A1 * | 10/2003 | Lee | 430/314 |
| 2003/0224606 A1 * | 12/2003 | Laaksonen et al. | 438/694 |
| 2008/0160256 A1 * | 7/2008 | Bristol et al. | 428/143 |

* cited by examiner

*Primary Examiner* — Savitr Mulpuri
(74) *Attorney, Agent, or Firm* — Jacqueline J. Garner; Wade J. Brady, III; Frederick J. Telecky, Jr.

(57) ABSTRACT

A method of patterning a plurality of polysilicon structures includes forming a polysilicon layer over a semiconductor body, and patterning the polysilicon layer to form a first polysilicon structure using a first patterning process that reduces line-edge roughness (LER). The method further includes patterning the polysilicon layer to form a second polysilicon structure using a second patterning process that is different from the first patterning process after performing the first patterning process.

18 Claims, 5 Drawing Sheets

GATE LINE EDGE ROUGHNESS REDUCTION BY USING 2P/2E PROCESS TOGETHER WITH HIGH TEMPERATURE BAKE

REFERENCE TO RELATED APPLICATION

This application claims priority to and the benefit of U.S. Provisional Application Ser. No. 61/142,072 which was filed Dec. 31, 2008, entitled "GATE LINE EDGE REDUCTION BY USING 2P/2E PROCESS TOGETHER WITH HIGH TEMPERATURE RESIST BAKE", the entirety of which is hereby incorporated by reference as if fully set forth herein.

FIELD OF INVENTION

The present invention relates generally to semiconductor devices and more particularly to a method of patterning polysilicon features with reduced pattern distortion.

BACKGROUND OF THE INVENTION

There is a constant drive within the semiconductor industry to increase overall performance and operating speed of integrated circuit devices, e.g., microprocessors, memory devices, communication chips, and the like. This drive is fueled by consumer demands for computers and electronic devices that operate at increasingly greater speeds. This demand for increased speed has resulted in a continual reduction in the size of semiconductor devices and the components that make up such devices, e.g., transistors. That is, many features of a typical field effect transistor (FET), e.g., channel length, junction depth, gate dielectric thickness, and the like, are reduced. For example, all other things being equal, the smaller the channel length of the transistor, the faster the transistor will operate. Thus, there is a constant drive to reduce the size, or scale, of the components of a typical transistor to increase device performance and the overall speed of the transistor, as well as integrated circuit devices incorporating such transistors.

In addition, there is a constant drive to increase the density of modern integrated circuit devices, i.e., to put more and more semiconductor devices, e.g., transistors, closer together on a single chip. Increasing the density of integrated circuit devices makes more efficient use of the semiconductor die area, and may assist in increasing the overall yield from semiconductor manufacturing operations.

One problem encountered in efforts to increase the density of modern integrated circuit devices arises in forming ever smaller critical dimension features. Typically, a polysilicon feature such as a transistor gate structure is formed by depositing a polysilicon layer over a substrate, followed by forming a photoresist layer over the polysilicon. The photoresist is then selectively exposed to ultraviolet radiation, and (in the cases of a positive photoresist) the exposed portions are removed by application of a developer solution. The patterned photoresist is then subsequently employed as an etch mask in patterning the underlying polysilicon.

One challenge in reducing the critical dimension of a polysilicon feature is line edge roughness (LER) of the developed photoresist, which then gets transferred down to the polysilicon during the subsequent etching. It is desirable to reduce line edge roughness to improve feature dimension control as scaling continues.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention relates to a method of patterning a plurality of polysilicon structures, and comprises forming a polysilicon layer over a semiconductor body. The polysilicon layer is then patterned to form a first polysilicon structure using a first patterning process that reduces line edge roughness (LER). The polysilicon layer is then subsequently patterned to form a second polysilicon structure using a second patterning process that is different from the first patterning process after performing the first patterning process.

In another embodiment of the invention, a method of patterning a polysilicon layer with two distinct, separate patterning processes is disclosed. The method comprises forming a first photoresist layer over the polysilicon layer, and patterning the first photoresist layer with a first patterning process that reduces line edge roughness (LER) (e.g., using a post-pattern photoresist high temperature bake). A portion of the polysilicon layer is patterned using the first patterned photoresist layer to form a plurality of first polysilicon structures having a layout symmetry associated therewith. A second photoresist layer is formed over the plurality of first polysilicon structures and over a remaining unpatterned portion of the single polysilicon layer, and the second photoresist layer is patterned with a second patterning process that is different than the first patterning process. A portion of the remaining unpatterned portion of the polysilicon layer is subsequently patterned to form one or more second polysilicon structures having a layout that is asymmetric with respect to the plurality of first polysilicon structures.

According to another embodiment of the invention, a method of forming a plurality of transistors is disclosed and comprises defining a plurality of active areas in a semiconductor body using one or more isolation regions, and forming a gate dielectric over the active areas. The method further comprises forming a polysilicon layer over the gate dielectric in the active areas, and over the isolation regions, and forming a first patterned photoresist layer with a first patterning process, that reduces line edge roughness (LER), over the polysilicon layer. The polysilicon layer is patterned using the first patterned photoresist layer as an etch mask resulting in a first plurality of polysilicon structures, and an unpatterned portion of the polysilicon layer. The first patterned photoresist layer is then removed after forming the first plurality of polysilicon structures, and a second patterned photoresist layer is formed over the first plurality of polysilicon structures and over the unpatterned portion of the polysilicon layer with a second patterning process that is different than the first patterning process. The method still further comprises patterning a portion of the unpatterned portion of the polysilicon layer using the second patterned photoresist layer as an etch mask to form one or more second polysilicon structures, and removing the second patterned photoresist layer after forming the one or more second polysilicon structures.

The following description and annexed drawings set forth in detail certain illustrative aspects and implementations of the invention. These are indicative of but a few of the various ways in which the principles of the invention may be employed.

DETAILED DESCRIPTION OF THE INVENTION

Figure 1:
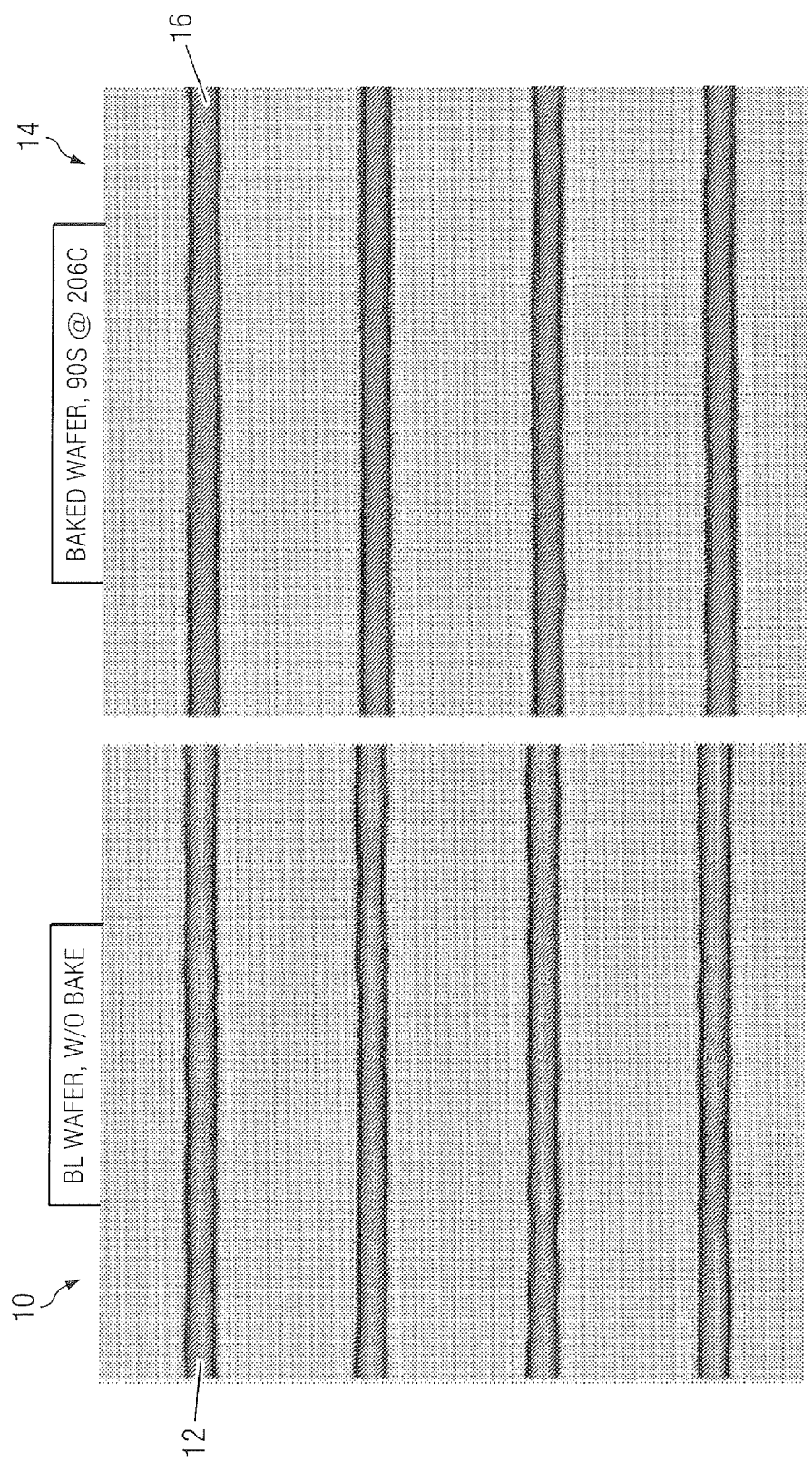
FIG. 1 is a prior art plan view diagram illustrating differences in polysilicon feature characteristics due to variations in the fabrication process.

One or more implementations of the present invention will now be described with reference to the attached drawings, wherein like reference numerals are used to refer to like elements throughout, and wherein the illustrated structures are not necessarily drawn to scale. The inventors of the present invention discovered that a conventional solution for reducing line edge roughness (LER) in polysilicon structures results in some undesired distortion. More particularly, it was discovered that a post-pattern photoresist high temperature bake, while reducing the polysilicon gate line edge roughness, caused increased polysilicon pattern distortion for selected feature layout configurations. The present invention comprises a two-step pattern (2P) and a two-step etch (2E) that addresses different feature configurations with different patterning processes to achieve decreased line edge roughness (LER) for selected features, while decreasing an amount of polysilicon pattern distortion that was associated with conventional polysilicon patterns. Details of the inventive method will be more fully appreciated in light of the detailed explanation provided below.

FIG. 1 is a prior art plan view of a baseline (BL) wafer 10 illustrating patterned polysilicon features 12 that were patterned without a photoresist post-pattern high temperature bake. Prior art FIG. 1 further illustrates another wafer 14 having polysilicon features 16 that were patterned with a post-pattern photoresist high temperature bake. More particularly, after exposing and developing the overlying photoresist, the photoresist pattern is subjected to a high temperature bake that is near, but below the melting point of the resist. In one example, the high temperature bake temperature is about 206 C for a duration of about 90 seconds. As can be seen in FIG. 1, the polysilicon features 16 experiencing the post-pattern high temperature resist bake before poly etch exhibit a 20-30% reduction in line edge roughness (LER) compared to the untreated features 12.

Figure 2A:
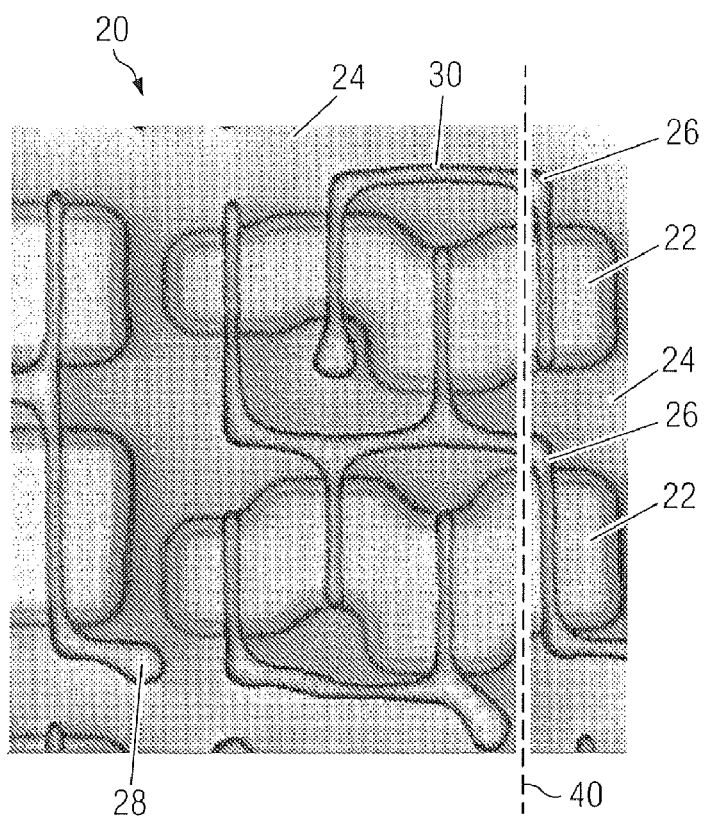
FIGS. 2A-2B are plan view diagrams illustrating differing levels of distortion due to variations in the fabrication process.
Figure 2B:
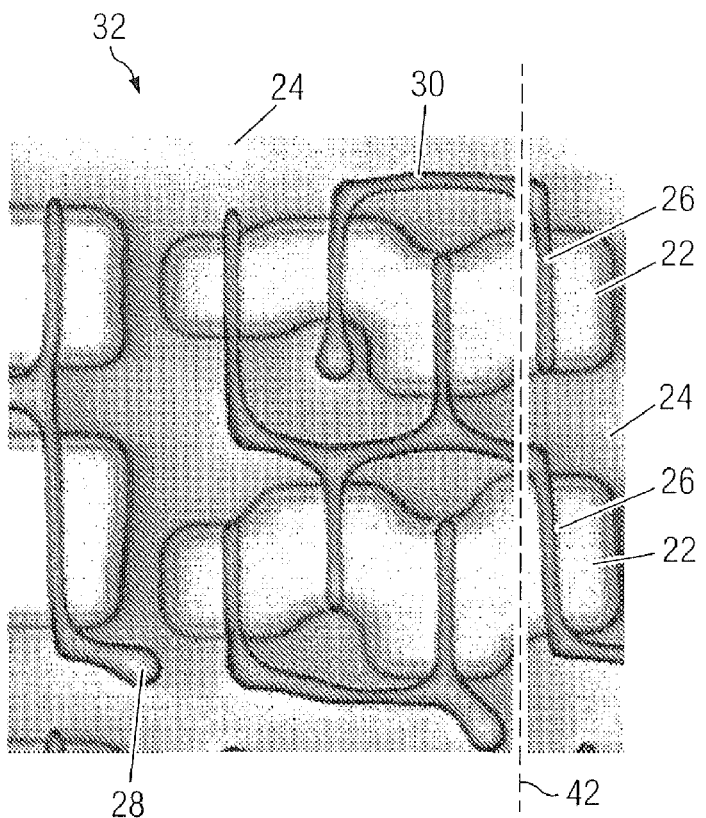

While the post-pattern high temperature resist bake advantageously provides for a reduction in line edge roughness, the inventors of the present invention discovered that the bake process results in a distortion of the pattern poly gates, as well as other select features, as may be more fully appreciated in FIGS. 2A and 2B. In FIG. 2A a plurality of patterned polysilicon features 20 are illustrated overlying active areas 22 and isolation regions 24, respectively. In general, the polysilicon features 26 overlying the active areas 22 are poly gates, while the polysilicon features 28 and 30 over the isolation regions 24 are poly contact pads and connecting field poly, respectively. In FIG. 2A, the polysilicon features 20 are not formed with a post-pattern photoresist high temperature bake.

In FIG. 2B, a plurality of polysilicon features 30 is also illustrated, wherein poly gates 26 overlie active areas 22, and poly contact pads 28 and connecting field poly features 30 overlie isolation regions 24, respectively. In FIG. 2B, the polysilicon features 30 are patterned with the post-pattern photoresist high temperature bake, and thus exhibit reduced line edge roughness. In addition, however, the polysilicon features 30 of FIG. 2B exhibit more pattern distortion than the polysilicon features 20 of FIG. 2A. Such distortion can be seen by comparing the deviation of the poly gates 26 that extend along dotted lines 40 and 42. As can be seen in FIG. 2B, the gates 26 deviate from the vertical dotted line 42 substantially more than the gates 26 deviate from the dotted line 40 of FIG. 2A.

Figure 3:
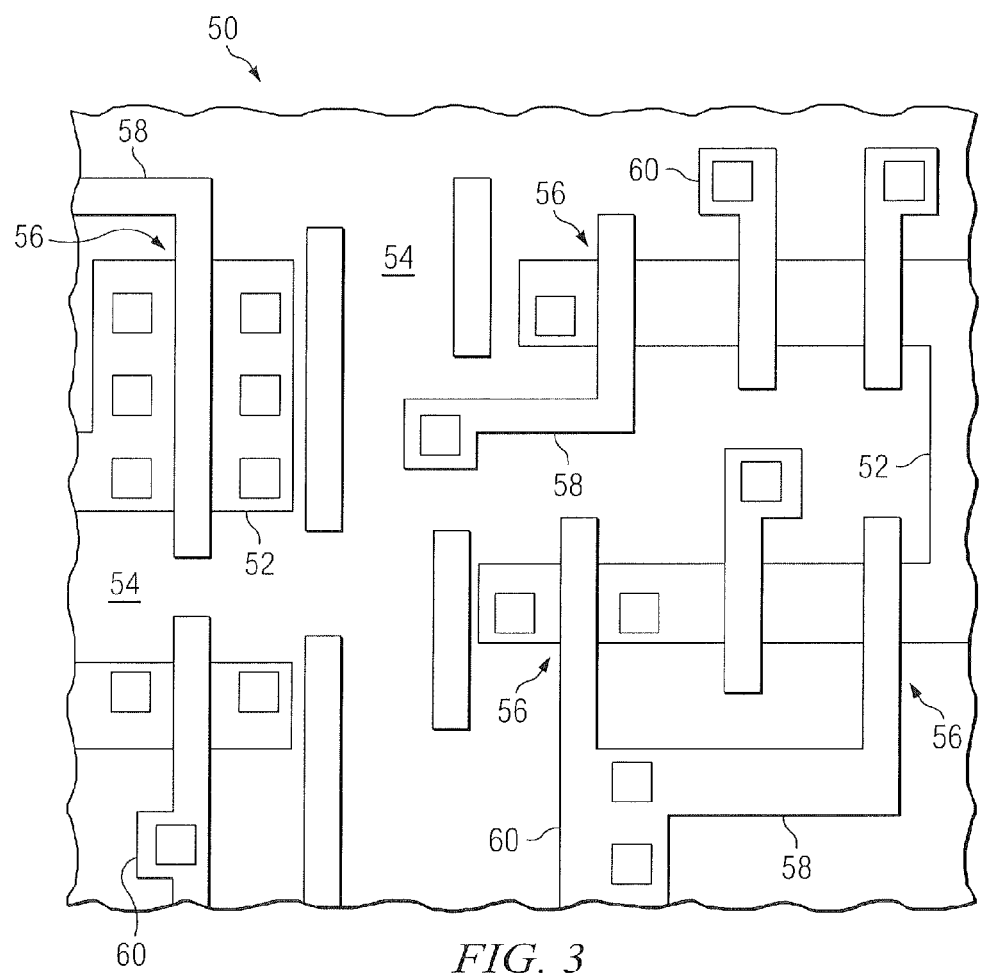
FIG. 3 is a plan view diagram illustrating polysilicon features and their layout characteristics that affect polysilicon distortion.

The reason for the increased distortion can be better appreciated in the context of FIG. 3. In FIG. 3 polysilicon features 50 extend over active regions 52 and isolation regions 54 surrounding the active regions. The distortions experienced by the poly gate features 56 are related to asymmetric poly layout configurations that include the connecting field poly 58 and the poly gate contact pads 60. With the asymmetric poly layout configurations, extra stresses in the polysilicon are induced from the post-pattern photoresist high temperature bake and subsequent poly etch, and because of the lateral asymmetry, the stresses do not balance each other. Consequently, the uneven application of stresses introduce more poly pattern distortion.

In appreciation of the cause of poly pattern distortion, the inventors disclose a segmentation of the poly patterning process into two or more separate, distinct patterning processes, wherein those features most apt to induce distortions into poly gate features are patterned with a different patterning process than that employed for the poly gates. In one embodiment of the invention, features such as poly gates that have a substantially symmetric layout configuration are patterned with a first process that reduces line edge roughness (LER), (e.g., using a post-pattern photoresist high temperature bake or other method of reducing LER) while other features such as connecting field poly and poly contact pads are patterned with a separate, distinct process that does not employ a post-pattern photoresist high temperature bake. Consequently, select patterns such as the poly gates exhibit reduced LER, while those features most apt to exert stresses on other features and cause resultant distortion do not get processed with the high temperature bake.

Figure 4A:
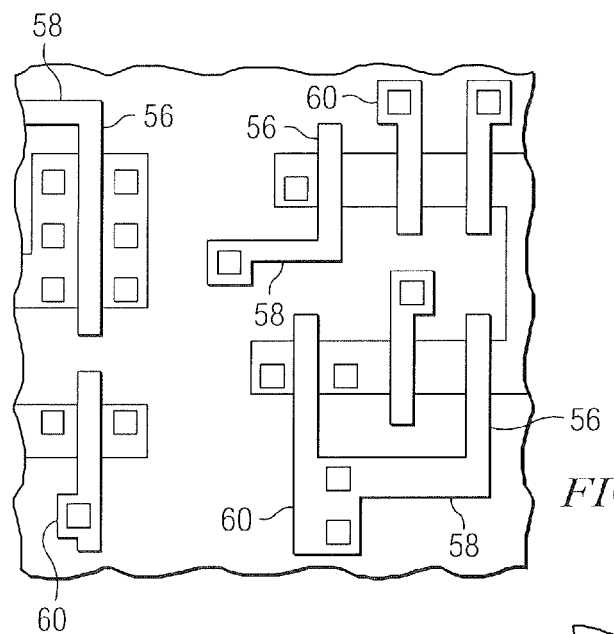
FIGS. 4A-4C are plan view diagrams illustrating differing types of masks for patterning a polysilicon layer in accordance with an embodiment of the invention.
Figure 4B:
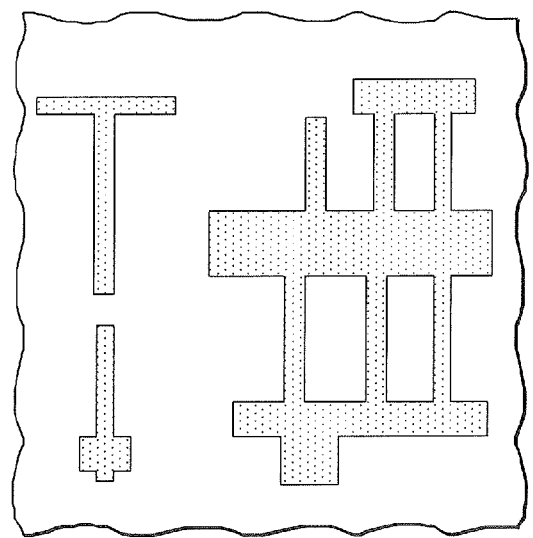
Figure 4C:
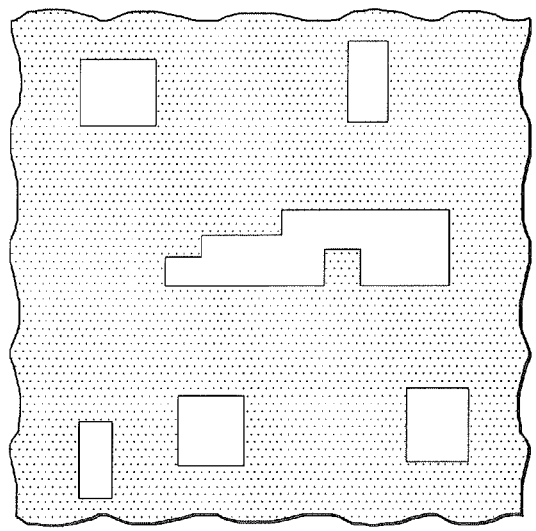

One example illustration of how the two-step pattern (2P) and two-step etch (2E) can work is illustrated in FIGS. 4A-4C. FIG. 4A illustrates polysilicon features comprising poly gates 56 connecting field poly 58 and gate contact pads 60. An original or conventional poly mask would concurrently form all the poly features shown in FIG. 4A in a single pattern and etch process. However, the two-step pattern (2P) and two-step etch (2E) utilizes a two mask set, shown in FIGS. 4B-4C. The two mask set comprises a first polysilicon processing mask, associated with a first patterning process, that forms polysilicon features including poly gates 56 (e.g., with a post-pattern photoresist high temperature bake) (see FIG. 4B). A second mask, configured for use with a 'dark field' exposure, 'cuts' away unwanted polysilicon features formed by the first mask and results in poly features 58 and the gate contact pads 60 (e.g., without a post-pattern photoresist high temperature bake) (see FIG. 4C) Therefore, the combined result of the two masks, shown in FIGS. 4B and 4C, is a layout that resembles that which is shown in FIG. 4A, and that reduces poly gate distortion compared to conventional polysilicon processing.

Figure 5:
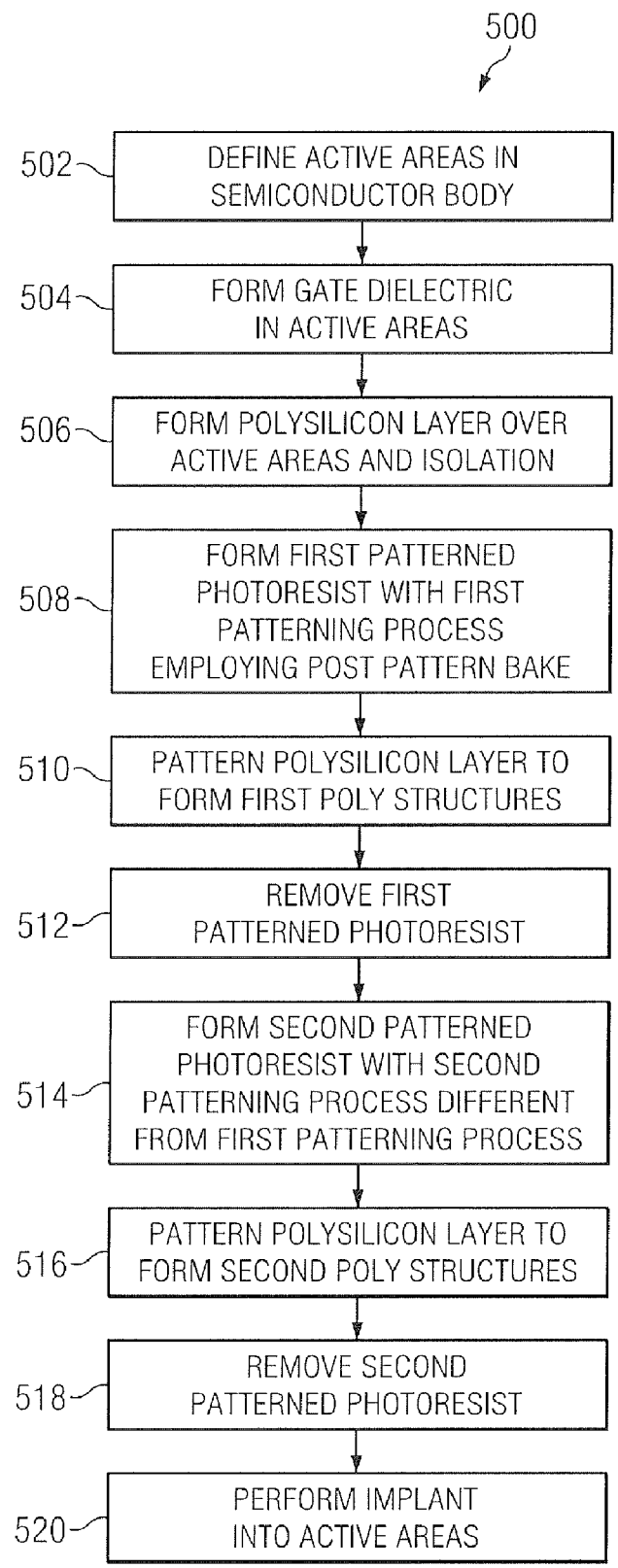
FIG. 5 is a flow chart diagram illustrating a method of forming a plurality of polysilicon features according to one embodiment of the invention.

Turning now to FIG. 5, a method 500 of patterning a plurality of polysilicon structures is provided. While the exemplary method 500 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

The method 500 begins at 502 with the defining of active areas in a semiconductor body. In one embodiment, isolation regions such as field oxide or shallow trench isolation structures are employed to define active areas therebetween. The active areas that are bounded by such isolation regions are then typically doped with n-type or p-type dopant to form n-wells or p-wells for PMOS and NMOS transistor fabrication, respectively. Examples of active areas bounded by isolation regions may be seen at 22 and 24 of FIGS. 2A and 2B, and 52 and 54 of FIG. 3.

A gate dielectric is then formed in the active areas at 504 of FIG. 5. In one embodiment, a gate dielectric comprises a thermally grown oxide, however, high-k gate dielectrics may be deposited in alternative embodiments. A polysilicon layer is then formed, at 506, over the gate dielectric in the active areas and over the isolation regions with a blanket deposition, such as, for example, a CVD process.

A first patterned photoresist is formed at 508 using a first patterning process that reduces LER. In one embodiment, the first patterning process comprises a post-pattern photoresist high temperature bake to reduce the line edge roughness associated therewith. The underlying polysilicon layer is then patterned via, for example, a dry etch at 510 using the first patterned photoresist as an etch mask. The patterning at 510 results in the formation of a plurality of polysilicon structures, as well as unpatterned portions of the polysilicon. The first patterned photoresist is then removed via, for example, an ashing process at 512.

In one embodiment a 'thermal flow assist layer' may be used during the first patterning process (e.g., associated with the first polysilicon processing mask) to improve the temperature sensitivity of the high-temp bake process. The thermal flow assist layer may be deposited onto polysilicon features after they have been patterned but prior to the high temperature bake process. In one embodiment, during the high-temp bake process the thermal flow assist layer contracts, pulling at the polysilicon structures in a manner that improves their configuration and results in a reduced LER.

Still referring to FIG. 5, a second patterned photoresist is then formed over the polysilicon layer at 514, wherein the second patterned photoresist is formed by a second patterning process that is different than the first patterning process. In one embodiment the second patterning process does not include a post-pattern photoresist high temperature bake. Rather, such a process may comprise depositing the photoresist, performing a low temperature resist bake, selectively exposing the resist to radiation, and developing the exposed photoresist. The underlying polysilicon layer is then again patterned, this time using the second patterned photoresist as an etch mask at 516. The second patterned photoresist is then removed at 518 via, for example, an ashing process.

By the two-step pattern (2P), two-step etch (2E) process set forth in FIG. 5, polysilicon structures may be fabricated with polysilicon gates exhibiting decreased line edge roughness without substantial adverse pattern distortion. For example, referring back to FIGS. 4B and 4C, features 56 may be patterned with the first patterning process, while the features 58 and 60 of FIG. 4C may be fabricated with the second patterning process.

The active areas may then be implanted to form transistor devices at 520, as may be appreciated.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of patterning a plurality of polysilicon structures, comprising:
    forming a polysilicon layer over a semiconductor body;
    performing a first patterning of the polysilicon layer to form a first polysilicon structure using a first patterning process that reduces line-edge roughness (LER), wherein the first patterning of the polysilicon layer reduces LER by performing a post-pattern high temperature bake of a developed first photoresist layer overlying the polysilicon layer, and wherein the post-pattern baked photoresist is used as an etch mask to pattern the polysilicon layer wherein the first patterning utilizes a thermal flow assist layer configured to improve temperature sensitivity of the post-pattern high temperature bake, and wherein the post-pattern high temperature bake of the developed photoresist is performed at a temperature below a melting point of the photoresist; and
    performing a second patterning of the polysilicon layer to form a second polysilicon structure using a second patterning process that is different from the first patterning process after performing the first patterning process.

2. The method of claim 1, wherein the first polysilicon structure and the second polysilicon structure have spatially different characteristics.

3. The method of claim 2, wherein the first polysilicon structure corresponds to a transistor gate structure, and the second polysilicon structure corresponds to one of a contact pad and a connecting field poly structure.

4. The method of claim 1, wherein the first patterning of the polysilicon layer results in the first polysilicon structure having a reduced distortion relative to the second polysilicon structure.

5. The method of claim 1, wherein the polysilicon structure comprises a gate structure in an active area disposed in a semiconductor body.

6. A method of patterning a single polysilicon layer with two distinct, separate patterning processes, comprising:
    forming a first photoresist layer over the single polysilicon layer;

patterning the first photoresist layer with a first patterning process that reduces line edge roughness (LER);

patterning a portion of the single polysilicon layer using the first patterned photoresist layer to form a plurality of first polysilicon structures having a layout symmetry associated therewith;

forming a second photoresist layer over the plurality of first polysilicon structures and over a remaining unpatterned portion of the single polysilicon layer;

patterning the second photoresist layer with a second patterning process that is different than the first patterning process; and patterning a portion of the remaining unpatterned portion of the single polysilicon layer to form one or more second polysilicon structures having a layout that is asymmetric with respect to the plurality of first polysilicon structures.

7. The method of claim 6, wherein patterning the first photoresist layer reduces LER by performing a post-pattern high temperature bake of the first photoresist prior to patterning a portion of the single polysilicon layer using the post-pattern baked photoresist as an etch mask.

8. The method of claim 7, wherein the post-pattern high temperature bake of the developed photoresist is performed at a temperature below a melting point of the photoresist.

9. The method of claim 7, wherein the first patterning utilizes a thermal flow assist layer configured to improve temperature sensitivity of the post-pattern high temperature bake.

10. The method of claim 6, wherein the plurality of first polysilicon structures comprise transistor gate structures extending along a transistor width direction.

11. The method of claim 10, wherein the one or more second polysilicon structures comprise one or more of a contact pad and a connecting field poly structure extending in a transistor length direction, wherein the transistor width direction and the transistor length direction are different directions.

12. A method of forming a plurality of transistors, comprising:

defining a plurality of active areas in a semiconductor body using one or more isolation regions;

forming a gate dielectric over the active areas;

forming a polysilicon layer over the gate dielectric in the active areas, and over the isolation regions;

forming a first patterned photoresist layer, with a first patterning process that reduces line edge roughness (LER), over the polysilicon layer;

patterning and etching the polysilicon layer using the first patterned photoresist layer as an etch mask resulting in a first plurality of polysilicon structures, and an unpatterned portion of the polysilicon layer;

removing the first patterned photoresist layer after forming the first plurality of polysilicon structures;

forming a second patterned photoresist layer over the first plurality of polysilicon structures and over the unpatterned portion of the polysilicon layer with a second patterning process that is different than the first patterning process;

patterning and etching a portion of the unpatterned portion of the polysilicon layer using the second patterned photoresist layer as an etch mask to form one or more second polysilicon structures; and removing the second patterned photoresist layer after forming the one or more second polysilicon structures.

13. The method of claim 12, wherein the first plurality of polysilicon structures comprise gate structures in the active areas, and further comprising performing an implant into the active areas, thereby forming transistors.

14. The method of claim 13, wherein the first plurality of polysilicon structures are symmetric with respect to one another.

15. The method of claim 14, wherein the one or more second polysilicon structures are asymmetric with respect to the first plurality of polysilicon structures.

16. The method of claim 12, wherein the first patterning process reduces LER by performing a post-pattern high temperature bake of a developed photoresist overlying the polysilicon prior to patterning and etching the polysilicon layer.

17. The method of claim 16, wherein the post-pattern high temperature bake of the developed photoresist is performed at a temperature below a melting point of the photoresist.

18. The method of claim 16, wherein the first patterning utilizes a thermal flow assist layer configured to improve temperature sensitivity of the post-pattern high temperature bake.

* * * * *